(12) United States Patent
Berry

(10) Patent No.: US 7,565,556 B2
(45) Date of Patent: Jul. 21, 2009

(54) SYSTEM AND METHOD FOR PROVIDING A CIRCUITRY MANAGEMENT SERVICE

(75) Inventor: Mark W. Berry, Sunnyvale, TX (US)

(73) Assignee: Fujitsu Limited, Kawasaki (JP)

( * ) Notice: Subject to any disclaimer, the term of this patent is extended or adjusted under 35 U.S.C. 154(b) by 528 days.

(21) Appl. No.: 11/290,041

(22) Filed: Nov. 30, 2005

(65) Prior Publication Data
US 2007/0124605 A1 May 31, 2007

(51) Int. Cl.
*G06F 1/00* (2006.01)
*G06F 1/32* (2006.01)

(52) U.S. Cl. ............... 713/300; 713/320; 713/323; 713/324; 713/330; 714/47

(58) Field of Classification Search ............ 713/300, 713/320, 323, 324, 330; 714/47
See application file for complete search history.

(56) References Cited

U.S. PATENT DOCUMENTS

| 4,922,448 | A  | * | 5/1990  | Kunieda et al. | ......... | 713/320 |
| 6,496,893 | B1 | * | 12/2002 | Arai           | ......... | 710/302 |
| 6,915,438 | B2 | * | 7/2005  | Boros          | ......... | 713/322 |
| 2007/0204015 | A1 | * | 8/2007 | Gonzalez Lopez et al. | .. | 709/223 |
| 2008/0052505 | A1 | * | 2/2008 | Theobald       | ......... | 713/1   |

* cited by examiner

*Primary Examiner*—Thomas Lee
*Assistant Examiner*—Michael J Brown
(74) *Attorney, Agent, or Firm*—Baker Botts L.L.P.

(57) ABSTRACT

In accordance with the teachings of the present invention, a system and method for providing a circuitry management service is provided. In a particular embodiment, the system includes a management circuit interface configured to receive a plug associated with a management service. The system also includes a power source. In addition, the system includes a management circuit operable to facilitate the management service. The management circuit includes one or more management circuit devices coupled to ground. The management circuit is coupled to the management circuit interface such that one or more of the management circuit devices are coupled to the power source only when the management circuit interface receives the plug.

29 Claims, 3 Drawing Sheets

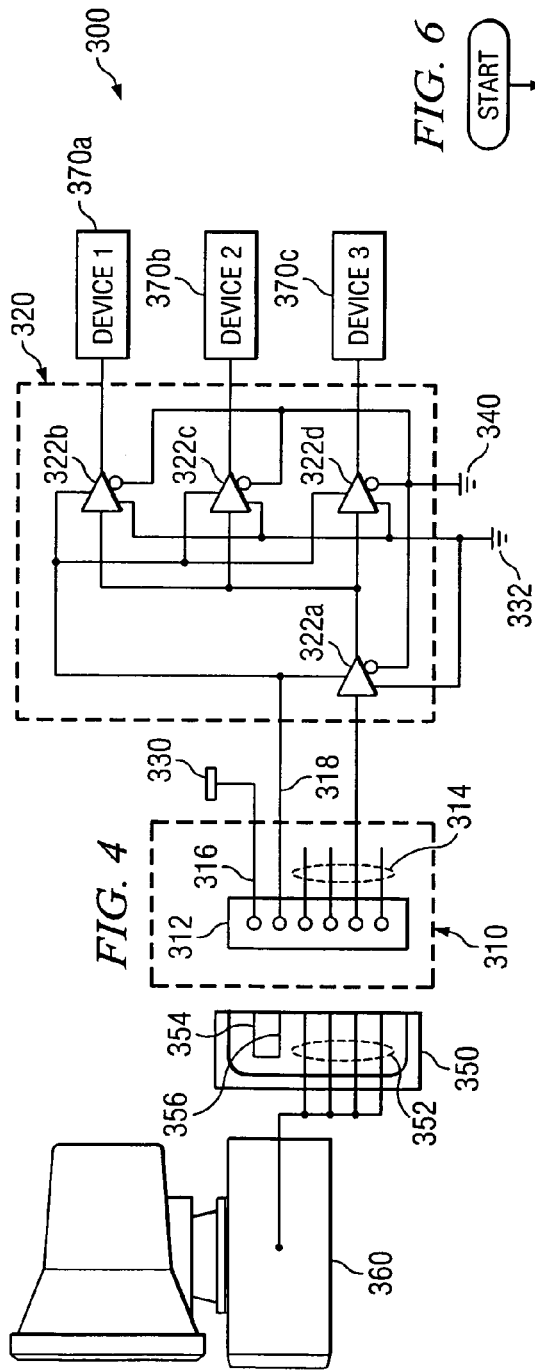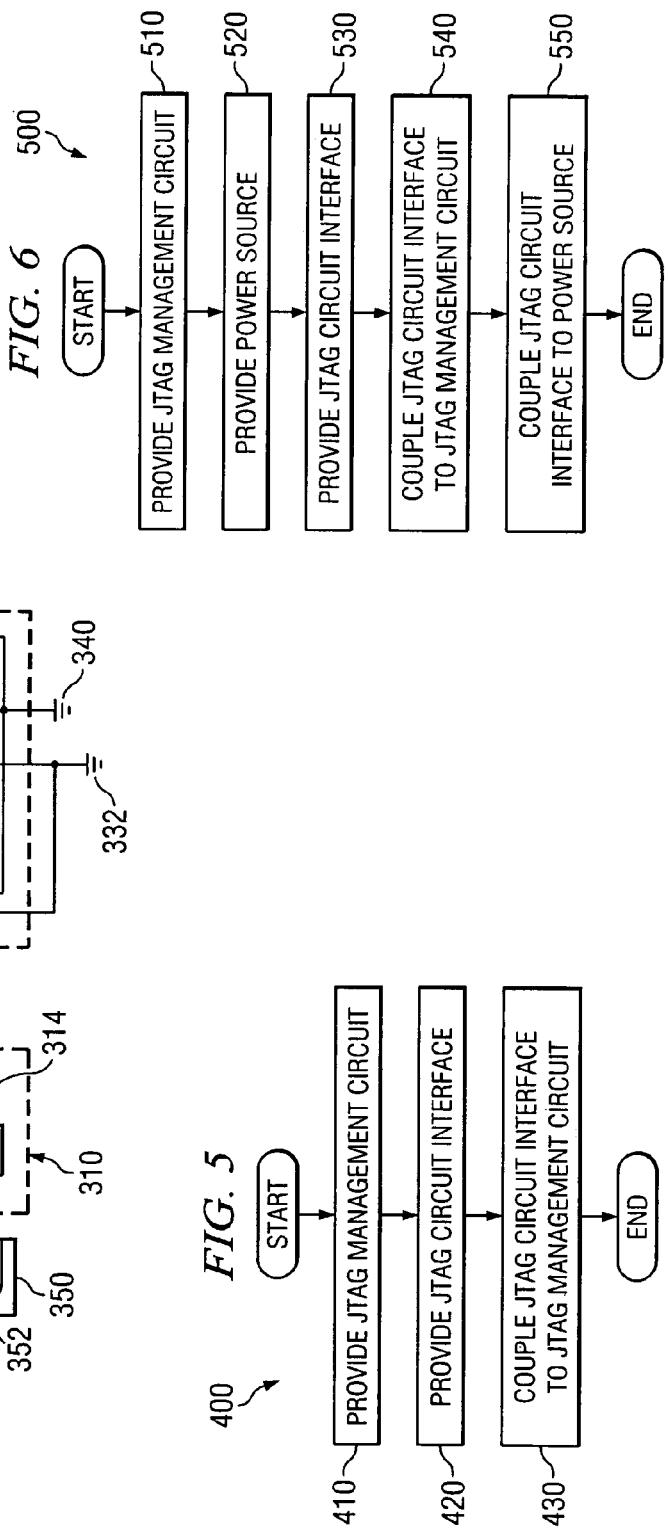

SYSTEM AND METHOD FOR PROVIDING A CIRCUITRY MANAGEMENT SERVICE

TECHNICAL FIELD OF THE INVENTION

The present invention relates generally to management circuitry and, more particularly, to a system and method for providing a circuitry management service.

BACKGROUND

For many years, a demand for greater computing power has generated more powerful computing devices in the computer industry. At the same time, consumers have demanded ever-smaller processing units to deliver the increased processing power. In response to this demand, the computer industry has miniaturized the components it uses, increased the density of components on circuit boards, and increased the power of the processing components. This trend has, for example, led the industry to decrease the size of circuit boards, increase the number of components on each circuit board, make the components more powerful, stack circuit boards in a shelf, and stack shelves in scalable systems. Unfortunately, having computing components consume greater power in smaller spaces has led to undesirable heating of components.

SUMMARY

In accordance with the teachings of the present invention, a system and method for providing a circuitry management service is provided. In a particular embodiment, the system includes a management circuit interface configured to receive a plug associated with a management service. The system also includes a management circuit operable to facilitate the management service. The management circuit includes one or more management circuit devices coupled to a power source. The management circuit is coupled to the management circuit interface such that one or more of the management circuit devices are enabled only when the management circuit interface receives the plug.

In accordance with another embodiment of the present invention, the system for providing a circuitry management service includes a management circuit interface configured to receive a plug associated with a management service. The system also includes a power source. In addition, the system includes a management circuit operable to facilitate the management service. The management circuit includes one or more management circuit devices coupled to ground. The management circuit is coupled to the management circuit interface such that one or more of the management circuit devices are coupled to the power source only when the management circuit interface receives the plug.

Technical advantages of one or more embodiments of the present invention may include decreasing power consumed by a processing unit by disabling circuits that are only used once or sporadically. Decreasing the power consumed by a processing unit may have many benefits. For example, decreasing power consumed may decrease the heat generated by a processing unit during regular use. Since heat affects the performance of the unit, decreasing heat generated may increase the performance of the unit. Net power would also be saved.

Another technical advantage of particular embodiments of the present invention may include redirecting to other circuit board components the power saved by disabling circuits. By disabling circuits that are only used once or sporadically, the power that would normally be consumed by these circuits during regular operation of the processing unit may be re-directed to other components or additional components, thereby increasing the net performance of the unit. Thus the heat "savings" by disabling some circuits may be used by other or additional circuits. Even though net heat generation may remain constant, performance of the unit increases.

Yet another technical advantage of particular embodiments of the present invention may include conserving power at little or no cost to manufacturers. In particular embodiments, disabling a management circuit does not require any substantial, additional expense (as would be the case if, for example, additional heat sinks were added to achieve similar results, which may not even be physically possible in some cases). Thus, power is saved (and heat generation reduced) at little or no cost.

For example, circuits that are used only during manufacturing to test the integrity of a circuit board may unnecessarily consume power during regular use of the processing unit. Thus, disabling these circuits according to particular embodiments of the present invention during regular use may decrease the unit's power consumption. Decreasing the unit's power consumption may decrease the heat generated by the unit and/or allow the unit to re-direct the saved power to other components. In either case, the performance of the processing circuit may increase at little or no cost.

It will be understood that the various embodiments of the present invention may include some, all, or none of the enumerated technical advantages. In addition, other technical advantages of the present invention may be readily apparent to one skilled in the art from the figures, description and claims included herein.

BRIEF DESCRIPTION OF THE DRAWINGS

For a more complete understanding of the present invention and its features and advantages, reference is now made to the following description, taken in conjunction with the accompanying drawings, in which:

FIG. 4 is a block diagram illustrating another system for providing a circuitry management service for circuitry in a circuit board according to another embodiment of the present invention;

FIG. 5 is a flowchart of an example method of manufacturing the management circuitry of FIG. 3 according to one embodiment of the present invention; and FIG. 6 is a flowchart of an example method of manufacturing the management circuitry of FIG. 4 according to another embodiment of the present invention.

DETAILED DESCRIPTION

Figure 1:
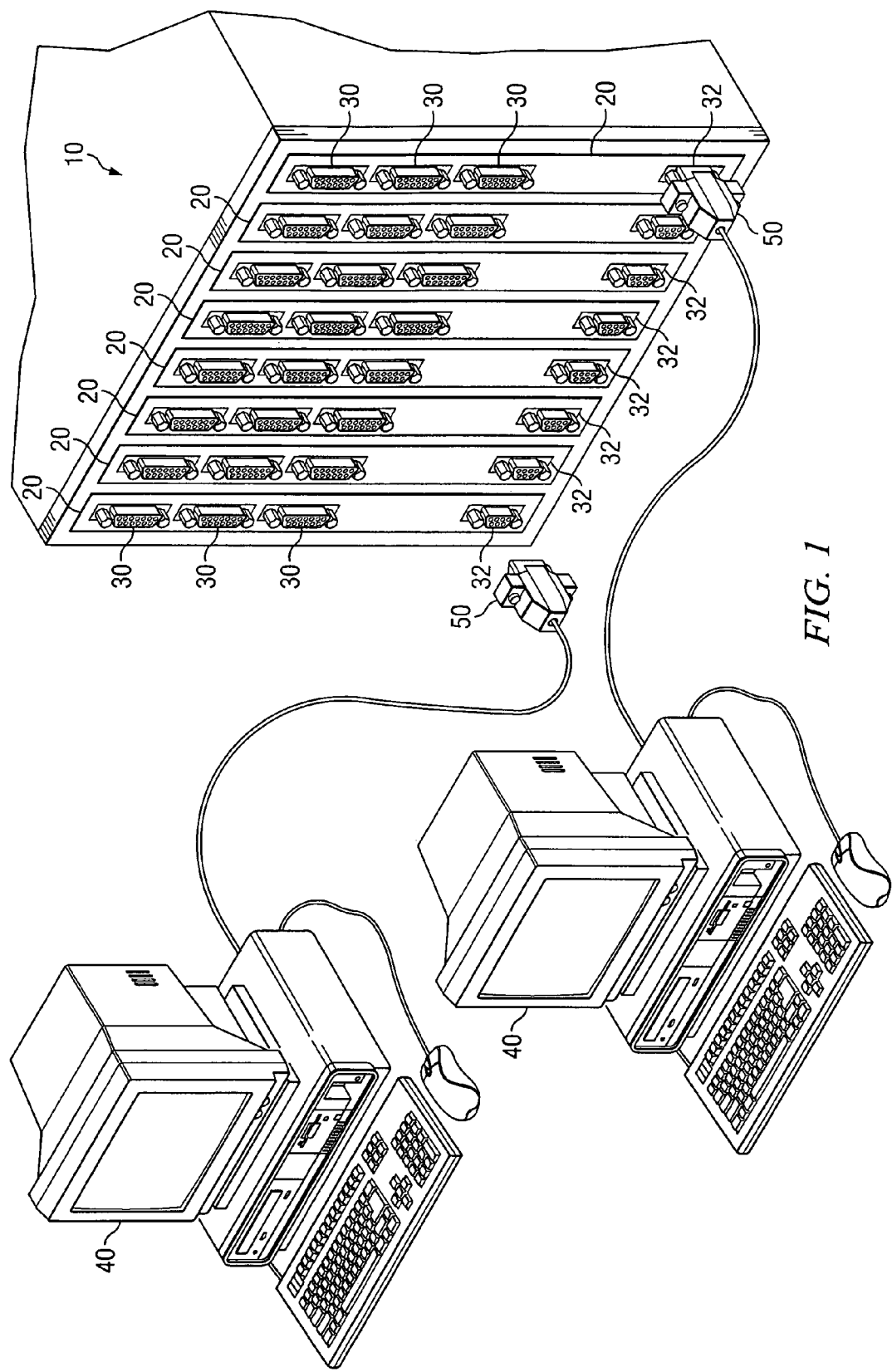
FIG. 1 is a diagram illustrating a shelf containing several circuit boards.

FIG. 1 is a diagram illustrating a shelf 10 containing several circuit boards 20. Each circuit board 20 contains one or more ports 30 for inputting and outputting signals. Each circuit board 20 also includes at least one port 32 for conducting a management service. Port 32 may also allow the inputting and outputting of other signals in particular embodiments. Each port 32 may be accessed by a device 40 through a suitable coupler 50. Port 32 of one of the circuit boards 20 in FIG. 1 is illustrated as being connected through a coupler 50 to a device 40. Device 40 may transmit and receive management signals through port 32 to and from circuit board 20.

Each circuit board 20 in the shelf 10 may contain many processing or other computing devices on the board that consume power and generate heat. As the power and density of components on processing units has increased over time, the heat generated by these units has increased as well. Each circuit board in FIG. 1 thus generates a considerable amount of heat. The proximity of the circuit boards in the shelf, driven by consumer demand for smaller computing devices, also limits heat dissipation.

Heat generation in computing devices has received greater attention in recent years as more miniaturized computing components have required more power in denser configurations. These components have generated greater amounts of heat in smaller spaces. Since computing devices experience decreased performance when exposed to higher temperatures, increased heat generation has motivated computer device manufacturers to find ways to decrease heat generated. Otherwise, heat generation will limit the ability of these manufacturers to manufacture increasingly more powerful computing devices. This has led computer makers to reexamine their computing device designs for possible ways to conserve power.

Figure 2:
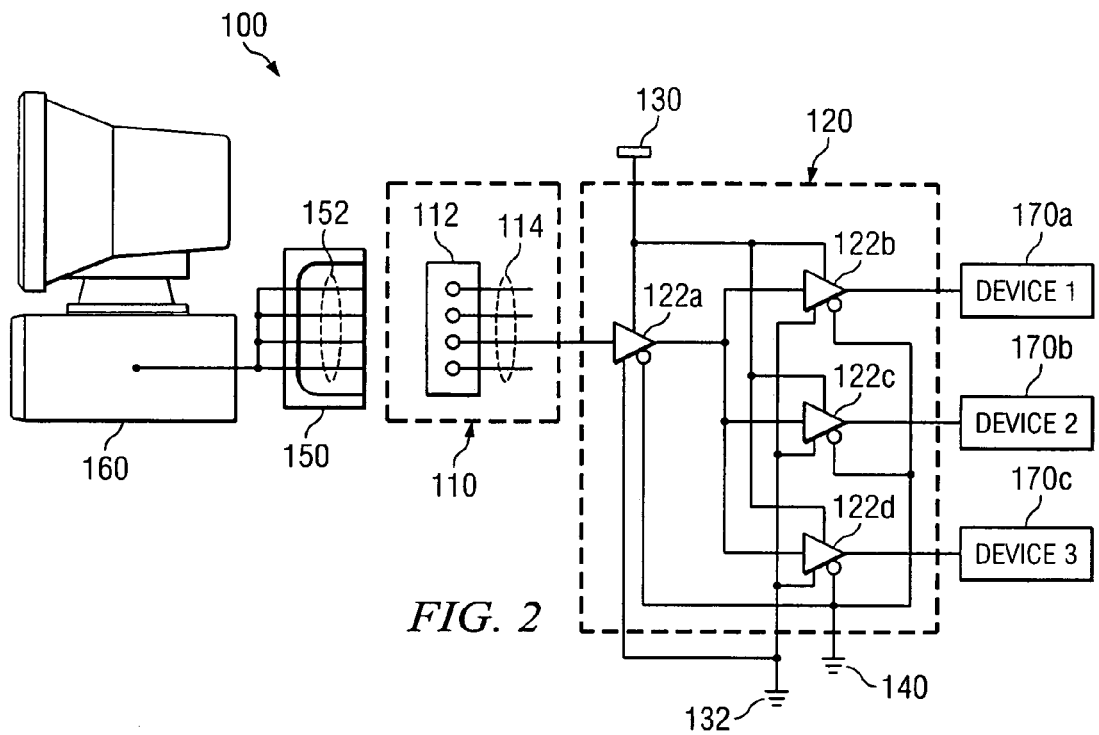
FIG. 2 is a block diagram illustrating a system to describe a typical manner for providing a circuitry management service in a circuit board.

One device design that has generated heat (and consumed power) inefficiently is the management circuit design of infrequently used management circuits in a circuit board, such as the joint test action group (JTAG) boundary scan circuits described below. Specifically, these management circuits are sometimes designed to remain powered even when the management circuits are not in use. FIG. 2 is a block diagram illustrating a system 100 for describing a typical manner of providing a circuitry management service in a circuit board. As used herein, a management service may include any service performed at any time, whether sporadically or even only once, to manage or assess the performance of one or more components on a circuit board. Management services may include, for example, diagnostic tests, synchronization procedures, maintenance checks, debugging analyses, programming, configuration, and upgrades of one or more components of a circuit board.

The specific management service described as being performed in conjunction with system 100 is a JTAG boundary scan (formally known as IEEE Standard 1149.1). JTAG boundary scan is primarily a circuit board testing standard and defines a hardware architecture and the mechanisms for its use. The boundary scan test architecture provides a means to test the boundary pins of a JTAG-compatible device on a circuit board without using physical test probes. Another application of the JTAG interface is to program field programmable devices and to program physical inventory. The JTAG boundary scan procedure is normally performed infrequently, typically by the circuit board manufacturer before the circuit board is sold (although the procedure may be performed after sale as well). Though referred to in conjunction with JTAG boundary scan, system 100 is also a typical system in other management contexts, such as, for example, synchronization systems using building integrated timing supply (BITS) and debugging systems.

The JTAG boundary scan system 100 includes a JTAG circuit interface 110 (which may be, for example, a port 32 of FIG. 1), a JTAG management circuit 120, a power source 130, a ground 132, an enable control 140, a plug 150 (which may be, for example, a coupler 50 of FIG. 1), a JTAG boundary scan service provider 160 (which may be, for example, a device 40 of FIG. 1), and JTAG-compatible circuit board devices 170. As mentioned above, JTAG boundary scan system 100 continuously powers its management circuit devices, even when management services are not being provided. Thus, system 100 generates heat inefficiently during the regular operation of the circuit board (on which JTAG management circuit 120 is located) when management services are not being performed.

JTAG circuit interface 110 includes a connector 112 and leads 114. Connector 112 houses leads 114. Connector 112 is referred to as the JTAG Test Access Port. Leads 114 may have a male or female configuration (or any configuration complementary to plug 104) and comprise any suitable conducting material. Leads 114 in JTAG system 100 include any suitable number of leads to couple JTAG management circuit 120 to a JTAG boundary scan service provider 160 through plug 150 (and not necessarily the amount shown in FIG. 2). For example, in some JTAG devices, leads 114 may include a voltage (Vcc) lead, a ground (Gnd) lead, a test clock (TCK) lead, a test mode select (TMS) lead, a test data in (TDI) lead, a test data out (TDO) lead, and an asynchronous reset signal (TRST) lead. Other JTAG devices may not include the TRST lead. Although management circuit 120 is illustrated in FIG. 2 as coupled to one lead 114, one or more other leads 114 may be coupled to JTAG management circuit 120 as well. One or more leads 114 may be coupled to JTAG management circuits other than JTAG management circuit 120.

JTAG management circuit 120 includes JTAG management circuit devices 122. In any management service context (including JTAG boundary scan), as used herein, "management circuit devices" may include any device requiring power during a management service and that may be disabled when the management service is no longer being performed. In the JTAG context, management circuit devices 122 may include buffers operable to buffer test signals, such as a JTAG test clock signal. The number of management circuit devices 122 may be related to the number of circuit board devices 170. Though four management circuit devices (122a-122d) are illustrated in FIG. 2, there may be any suitable number of management circuit devices 122 in JTAG management circuit 120.

In JTAG boundary scan system 100, power source 130 may include any power source delivering any amount of power suitable to power JTAG management circuit 120. Power source 130 may supply direct current voltage (Vcc) to the management circuit 120. In some JTAG boundary scan systems 100, power source 130 supplies 3.3 volts of direct current voltage to the JTAG management circuit 120. Ground 132 refers to any material that is at earth potential. Enable control 140 in JTAG boundary scan system 100 refers to any enable or standby control mechanism. Enable control 140 can either be a ground or $V_{cc}$ potential. In system 100, power source 130 and enable control 140 are coupled to JTAG management circuit 120. JTAG management circuit 120 is thereby enabled, even when a management service is not being provided.

In JTAG boundary scan system 100, plug 150 connects to JTAG circuit interface 110 to couple JTAG management circuit 120 to JTAG boundary scan service provider 160 during a JTAG boundary scan service. Plug 150 may be removed after a JTAG boundary scan service ends. Plug 150 includes leads 152 that have a male or female configuration (or any configuration complementary to connector 112) and that comprise any suitable conducting material. Leads 152 in plug 150 include any suitable number of leads to couple plug 150 to leads 114 of JTAG circuit interface 110.

JTAG boundary scan service provider 160 transmits and receives signals to and from JTAG-compatible circuit board devices 170, respectively, during a JTAG boundary scan service, thereby assessing the performance of circuit board devices 170. JTAG boundary scan service provider 160 may comprise for example, a signal processor. As mentioned above, the JTAG boundary scan service is normally performed infrequently, typically by the manufacturer of the circuit board before the circuit board is sold (although the procedure may be performed after sale as well). JTAG signals transmitted may include, for example, a TCK, a TMS, and a TDI signal. JTAG signals may include different and/or additional signals as well. In any management service context (including JTAG boundary scan), as used herein, service provider may include any suitable device that provides a management service for one or more devices on a circuit board.

One or more JTAG-compatible circuit board devices 170 are communicatively coupled to JTAG management circuit 120. In any management service context (including JTAG boundary scan), as used herein, circuit board devices may include any suitable device on a circuit board that participates in the management service provided by a management service provider. In the JTAG context, JTAG-compatible circuit board devices 170 conform to the JTAG boundary scan standard (IEEE Standard 1149.1), and may be managed by JTAG boundary scan service provider 160. As mentioned above, generally speaking, there is a relation between the number of JTAG-compatible circuit board devices 170 and the number of management circuit devices 122. Though three JTAG-compatible circuit board devices (170a, 170b, and 170c) are illustrated in FIG. 2, there may be any suitable number of JTAG-compatible circuit board devices 170 on the circuit board.

In operation, a JTAG boundary scan service begins after plug 150 connects to JTAG circuit interface 110, and JTAG boundary scan service provider 160 begins transmitting and receiving signals to and from JTAG-compatible circuit board devices 170. After JTAG boundary scan service provider 160 transmits a signal, one or more leads 152 in plug 150 receive the signal and pass the signal to JTAG circuit interface 110. JTAG circuit interface 110 receives the signal at leads 114 in connector 112 and passes the signal along one or more leads 114 to management circuit devices 122 of JTAG management circuit 120. In the JTAG context, management circuit devices 122 include buffers that buffer the signal and pass the buffered signal to JTAG-compatible circuit board devices 170. JTAG-compatible circuit board devices 170 receive the passed signal. Based on the JTAG signals that they receive, devices 170 output one or more signals. JTAG boundary scan service provider 160 receives these signals from devices 170 and assesses or manages devices 170. This process continues until the JTAG boundary scan service ends, at which point plug 150 is manually disconnected from JTAG circuit interface 110.

Inefficient generation of heat (and waste of power) may occur in JTAG boundary scan system 100 after plug 150 is disconnected from JTAG circuit interface 110 and the JTAG boundary scan service ends. At this point, though JTAG boundary scan service has ended, management circuit devices 122 of management circuit 120 continue to provide drive current to devices 170. After the JTAG boundary scan service ends, management circuit devices 122 are no longer in use and no longer need current. Thus, the flow of unneeded current generates heat and uses power inefficiently in management circuit 120.

Figure 3:
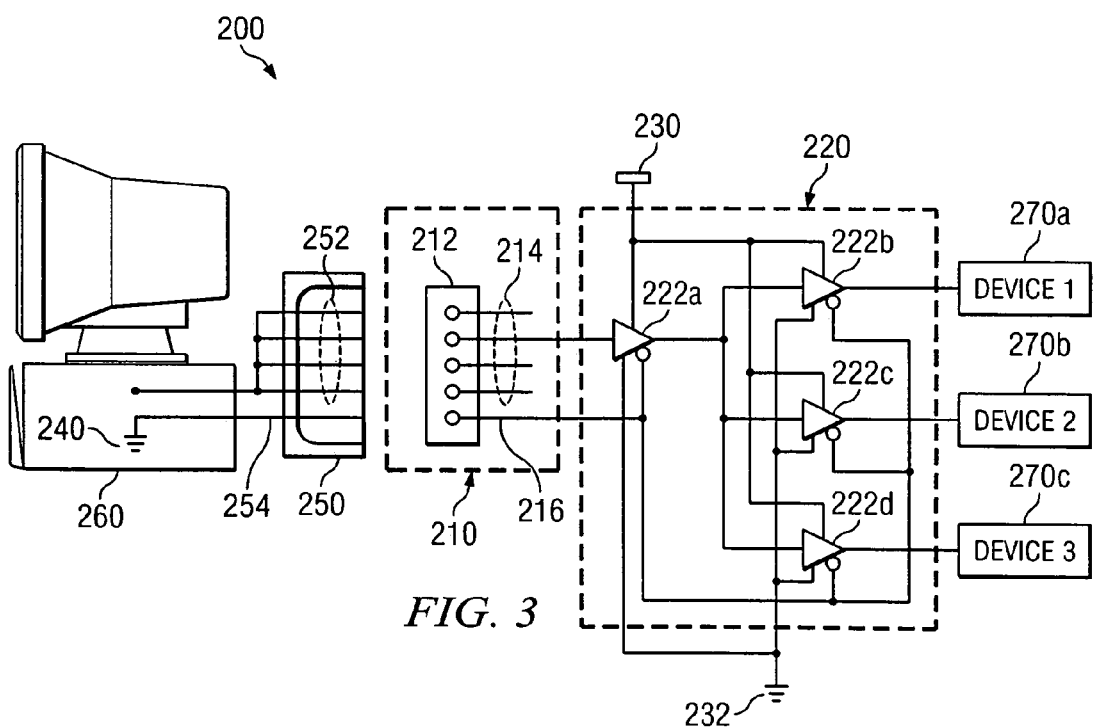
FIG. 3 is a block diagram illustrating a system for providing a circuitry management service for circuitry in a circuit board according to one embodiment of the present invention.

FIG. 3 is a block diagram illustrating a system 200 for providing a circuitry management service for circuitry in a circuit board according to one embodiment of the present invention. Unlike system 100, system 200 may provide, in particular embodiments, an enable that may be manually added during the provision of a management service (thereby enabling the management circuit) and may be manually removed after the provision of the management service (thereby disabling the management circuit). By disabling the management circuit after a management service ends, in particular embodiments, system 200 may conserve power and reduce the amount of heat generated by a circuit board during its regular operation. Although system 200, in particular embodiments, may be used for any management service, example system 200 will be described below in conjunction with a JTAG boundary scan service.

System 200, applied in the JTAG boundary scan context in this embodiment, includes a JTAG circuit interface 210 (which may be, for example, a port 32 of FIG. 1), a JTAG management circuit 220, a power source 230, a ground 232, a plug 250 (which may be, for example, a coupler 50 of FIG. 1), an enable control 240, a JTAG boundary scan service provider 260 (which may be, for example, a device 40 of FIG. 1), and JTAG-compatible circuit board devices 270. As mentioned above, JTAG boundary scan system 100 of FIG. 2 may continuously (and inefficiently) enable its management circuit devices, even when management services are not being provided. The JTAG boundary scan system 200 of FIG. 3 avoids this inefficient powering by allowing its management circuit devices to be manually disabled when a JTAG boundary scan service is not being provided. Example system 200 is operable to do so by removing the enable from the management circuit when the management service ends. Thus, system 200 may reduce the heat generated during the regular operation of the circuit board when management services are not being provided.

In particular embodiments, JTAG circuit interface 210 comprises a connector 212, leads 214, and enabling lead 216. Connector 212 may house leads 214 and enabling lead 216. Leads 214 and enabling lead 216 may have, in particular embodiments, a male or female configuration (or any configuration complementary to leads 252 and enabling lead 254, respectively, in plug 250) and comprise any suitable conducting material. Enabling lead 216 may be coupled to management circuit devices 222 of management circuit 220 such that enabling lead 216 enables management circuit devices 222 when lead 216 is coupled to enabling lead 254 of plug 250 during a JTAG management service. Leads 214 and enabling lead 216 may include any suitable number of leads to couple management circuit 220 to a service provider 260 through plug 250 (and not necessarily the amount shown in FIG. 3). Although management circuit 220 is illustrated in FIG. 3 as coupled to two leads (a lead 214 and enabling lead 216), in particular embodiments, one or more other leads 214 and/or 216 may be coupled to JTAG management circuit 220 as well. In particular embodiments, one or more leads 214 and/or 216 may be coupled to JTAG management circuits other than JTAG management circuit 220.

JTAG management circuit 220 may include management circuit devices 222. In the JTAG context, in particular embodiments, management circuit devices 222 may include buffers operable to buffer test signals, such as a JTAG test clock signal. Management circuit devices 222 may also support output control or standby mode (enable mode). Although four management circuit devices (222a-222d) are illustrated in FIG. 3, in particular embodiments, JTAG management circuit 220 may comprise any suitable number of management circuit devices (and not necessarily the number in FIG. 3). The number of management circuit devices 222 may be related to the number of circuit board devices 270 in particular embodiments. Additionally, the configuration of management circuit devices 222 may also differ, in particular embodiments, from that illustrated.

In example JTAG boundary scan system 200, power source 230 may include any power source delivering any amount of power suitable to power JTAG management circuit 220. In particular embodiments, power source 230 may supply direct current voltage ($V_{cc}$) to the management circuit 220. For example, power source 230 may supply 3.3 volts of direct current voltage in particular embodiments. Power source 230 may be coupled to JTAG management circuit 220 using any suitable means, and power source 230 may be located in any suitable location. Power source 230 may comprise, for example, a shelf power source in particular embodiments. Ground 232 refers to any material that is at earth potential. Ground 232 may be coupled to JTAG management circuit 220 using any suitable means, and ground 232 may be located in any suitable location.

In JTAG boundary scan system 200, plug 250 is operable to connect to JTAG circuit interface 210, thereby coupling JTAG boundary scan service provider 260 to JTAG management circuit 220 during a JTAG boundary scan service. Plug 250 may house leads 252 and/or enabling lead 254 in particular embodiments. Leads 252 and/or enabling lead 254 may also be coupled to the JTAG boundary scan service provider 260. Alternatively, enabling lead 254 may be coupled to enable control 240 in another suitable device (not illustrated). Leads 252 and/or enabling lead 254 may have, in particular embodiments, a male or female configuration (or any configuration complementary to leads 214 and enabling lead 216, respectively, of connector 212) and comprise any suitable conducting material. In particular embodiments, leads 252 and enabling lead 254 in plug 250 may include any suitable number of leads to couple service provider 260 to management circuit 220 through circuit interface 210 (and not necessarily the amount illustrated in FIG. 3).

Enabling lead 254 may be coupled to an enable control 240. Enable control 240 in JTAG boundary scan system 200 refers to any enable or standby control mechanism. Enable control 240 may be a ground or $V_{cc}$ potential. Enable control 240 may be supplied from any suitable location, including, for example, from JTAG boundary scan service provider 260. In alternate embodiments, enable 240 may be supplied from any other suitable location. When enabling lead 254 of plug 250 is connected to enabling lead 216 of connector 212 during a management service, enabling lead 254 connects enabling lead 216 to enable control 240, thereby enabling management circuit 220. When enabling lead 254 is disconnected from enabling lead 216 after a management service ends (and after plug 250 is manually unplugged from JTAG circuit interface 210), enabling lead 216 no longer enables the management circuit 220. Power may thus be conserved in management circuit 220.

JTAG boundary scan service provider 260 is operable to transmit and receive management signals to and from the circuit board, respectively, during the JTAG boundary scan service, thereby managing the performance of JTAG-compatible circuit board devices 270. In particular embodiments, JTAG boundary scan service provider 260 may comprise, for example, a signal processor or any other suitable computing device. As mentioned above, the JTAG boundary scan service is normally performed infrequently, typically by the manufacturer of the circuit board before the circuit board is sold (although the procedure may be performed by any suitable party and/or after sale as well). In particular embodiments, JTAG signals transmitted may include, for example, a test clock signal (TCK), a mode input signal (TMS) (which provides the control logic for JTAG), and a serial data input signal to all JTAG instruction and data registers (TDI). In particular embodiments, JTAG signals may include different or additional signals as well.

In particular embodiments, JTAG-compatible circuit board devices 270 may include any device on a circuit board that participates in the JTAG management service. In particular embodiments, there may be one or more JTAG-compatible circuit board devices 270 on the circuit board communicatively coupled to JTAG management circuit 220 (and not necessarily the amount shown in FIG. 3). JTAG-compatible circuit board devices 270 may conform to the JTAG boundary scan standard (IEEE Standard 1149.1), and may be managed by JTAG boundary scan service provider 260. In particular embodiments, there may be a relation between the number of JTAG-compatible circuit board devices 270 and the number of management circuit devices 222 of JTAG management circuit 220.

In operation, in particular embodiments, a JTAG boundary scan service begins when plug 250 connects to JTAG circuit interface 210, and JTAG boundary scan service provider 260 begins transmitting and receiving signals to and from JTAG-compatible circuit board devices 270. After JTAG boundary scan service provider 260 transmits a signal, one or more leads 252 in plug 250 receive the signal and pass the signal to JTAG circuit interface 210. Connecting enabling lead 254 of plug 250 to enabling lead 216 of JTAG circuit interface 210 enables the JTAG management circuit 220, allowing power to flow through JTAG management circuit 220 and enabling management circuit devices 222. JTAG circuit interface 210 receives the signal at leads 214 in connector 212 and passes the signal along one or more of the leads 214 to management circuit devices 222 of JTAG management circuit 220. In the JTAG context, management circuit devices 222 may include buffers that buffer the signal and pass the buffered signal to JTAG-compatible circuit board devices 270. JTAG-compatible circuit board devices 270 receive the passed signal. Based on the JTAG signals that they receive, devices 270 output one or more signals. JTAG boundary scan service provider 260 receives these signals from devices 270 and assesses devices 270. This process continues until the JTAG boundary scan service ends, at which point plug 250 is manually disconnected from JTAG circuit interface 210.

As opposed to JTAG boundary scan system 100 of FIG. 2, it is less likely that example JTAG boundary scan system 200 of FIG. 3 inefficiently generates heat (or wastes power) by enabling management circuit devices even after a JTAG management service has ended. Instead, in particular embodiments, once a JTAG management service has ended, plug 250 may be removed from circuit interface 210, disconnecting enable control 240 (provided by plug 250) from JTAG management circuit 220. Without enable control 240 connected to JTAG management circuit 220, drive current does not flow through circuit 220. Thus, power is conserved. In particular embodiments, the power conserved per management circuit device 222 by disabling the management circuit device 222 according to example system 200 may be approximately forty milliwatts. This is a considerable power savings (and reduction in heat generation) if one considers how many management circuit devices may be used in one circuit board (or in one shelf comprising more than one circuit board). Thus, system 200 provides a substantial advantage in power conservation over typical systems 100 of FIG. 2. It should be noted that, although in the particular embodiment illustrated in FIG. 3, enabling lead 254 enables management circuit 220 when plug 250 is coupled to JTAG circuit interface 210, other embodiments may include any suitable configuration allowing enable control 240 to be manually coupled to management circuit 220 during a JTAG management service.

As discussed above, although example system 200 has been described in conjunction with JTAG boundary scan, in particular embodiments, system 200 may be used in conjunction with other management services, such as, for example, diagnostic tests, synchronization procedures, maintenance checks, debugging analyses, programming, configuration, and upgrades of one or more components of a circuit board. Modifications, additions, or omissions may be made to system 200 described without departing from the scope of the invention. The components of system 200 described may be integrated or separated according to particular needs. Moreover, the operations of system 200 may be performed by more, fewer, or other components.

FIG. 4 is a block diagram illustrating another system 300 for providing a circuitry management service for circuitry in a circuit board according to another embodiment of the present invention. Unlike system 100, system 300 may provide, in particular embodiments, a plug for powering a management circuit during the provision of the management service (thereby enabling the management circuit) and for unpowering the management circuit after the provision of the management service (thereby disabling the management circuit). By disabling the management circuit after a management service ends, system 300 may conserve power and reduce the amount of heat generated by a circuit board during its regular operation. Although system 300, in particular embodiments, may be used for any management service, example system 300 will be described below in conjunction with a JTAG boundary scan service.

System 300, applied in the JTAG boundary scan context in this embodiment, may include a JTAG circuit interface 310 (which may be, for example, a port 32 of FIG. 1), a JTAG management circuit 320, a power source 330, a ground 332, an enable 340, a plug 350 (which may be, for example, a coupler 50 of FIG. 1), a JTAG boundary scan service provider 360 (which may be, for example, a device 40 of FIG. 1), and JTAG-compatible circuit board devices 370. As mentioned above, JTAG boundary scan system 100 of FIG. 2 may continuously (and inefficiently) power its management circuit devices, even when management services are not being provided. The JTAG boundary scan system 300 of FIG. 4 avoids this inefficient powering by allowing its management circuit devices to be manually disabled by unpowering the circuit when a JTAG boundary scan service is not being provided. Example system 300 is operable to do so in particular embodiments by decoupling the power source 330 from the management circuit 320 when the management service ends (and the plug is removed). In alternate embodiments, the ground 322 may be decoupled from the management circuit 320 when the management service ends (and the plug is removed). In particular embodiments, the power source 330 and the ground 322 may be decoupled from the management circuit 320 when the management service ends. Thus, system 300 may reduce the heat generated during the regular operation of the circuit board when management services are not being provided.

In particular embodiments, JTAG circuit interface 310 comprises a connector 312, leads 314, and powering leads 316 and 318. Connector 312 may house leads 314 and powering leads 316 and 318. Leads 314 and powering leads 316 and 318 may have, in particular embodiments, a male or female configuration (or any configuration complementary to leads 352 and powering leads 354 and 356, respectively, in plug 350) and comprise any suitable conducting material. In particular embodiments, powering lead 316 may be coupled to power source 330, even after a management service has ended. Powering lead 318 may be coupled to management circuit devices 322 of management circuit 320 such that powering lead 318 provides power to management circuit devices 322 when powering lead 318 is coupled through plug 350 to power source 330 during a JTAG management service. Leads 314 and powering leads 316 and 318 may include any suitable number of leads to couple management circuits 320 to a service provider 360 through plug 350 (and not necessarily the amount shown in FIG. 4). Although management circuit 320 is illustrated in FIG. 4 as coupled to three leads (a lead 314 and powering leads 316 and 318), in particular embodiments, one or more other leads 314 and/or 318 may be coupled to JTAG management circuit 320 as well. In particular embodiments, one or more leads 314 and/or 318 may be coupled to JTAG management circuits other than JTAG management circuit 320. It should be noted that in particular embodiments management circuit 320 may be powered through plug 350 in ways not illustrated in FIG. 4. For example, alternate embodiments may couple ground 332 (or ground 332 and enable control 340), instead of power 330, through the plug 350 to power (and enable) the management circuit 320 during a management service. In those embodiments, the power source 330 may be coupled to the circuit 320 at all times. In those embodiments, the management circuit 320 would not be powered until coupled to ground 332 through the plug 350. In alternate embodiments, both power source 330 and ground 332 may be coupled to the management circuit 320 solely through plug 350, powering management circuit 320 only when coupled to management circuit 320 through plug 350 (during a management service).

JTAG management circuit 320 may include management circuit devices 322. In the JTAG context, in particular embodiments, management circuit devices 322 may include buffers operable to buffer test signals, such as a JTAG test clock signal. In particular embodiments, management circuit devices 322 may support enable or standby mode. In alternate embodiments, management circuit devices 322 may not support enable or standby mode. Although four management circuit devices (322a-322d) are illustrated in FIG. 4, in particular embodiments, JTAG management circuit 320 may comprise any suitable number of management circuit devices (and not necessarily the number in FIG. 4). The number of management circuit devices 322 may also be related to the number of circuit board devices 370 in particular embodiments. Additionally, the configuration of management circuit devices may also differ, in particular embodiments, from that illustrated.

In example JTAG boundary scan system 300, power source 330 may include any power source delivering any amount of power suitable to power JTAG management circuit 320. In particular embodiments, power source 330 may supply direct current voltage ($V_{cc}$) to the management circuit 320. For example, power source 330 may supply 3.3 volts of direct current voltage in particular embodiments. Power source 330 may be located in any suitable location, and power source 330 may comprise, for example, a shelf power source in particular embodiments. In the illustrated embodiment of FIG. 4, power source 330 is electrically coupled to management circuit 320 during a management service and may be electrically uncoupled from management circuit 320 after a management service ends. Ground 332 in JTAG boundary scan system 300 refers to any material that is at earth potential. Ground 332 may be located in any suitable location, and may be coupled to management circuit devices 322 of management circuit 320 in any suitable manner. Enable control 340 in JTAG boundary scan system 300 refers to any enable or standby control mechanism. Enable control 340 may be a ground or $V_{cc}$ potential. Enable control 340 may be supplied from any suitable location in particular embodiments. In particular embodiments (not illustrated in FIG. 4), management circuit devices 320 may not support enable or standby mode, and enable control 340 may not be a part of system 300 in those embodiments.

In JTAG boundary scan system 300, plug 350 is operable to connect to JTAG circuit interface 310, thereby coupling JTAG boundary scan service provider 360 to JTAG management circuit 320 during a JTAG boundary scan service. Plug 350 may house leads 352 and/or powering leads 354 and 356 in particular embodiments. Leads 352 and/or powering leads 354 and 356 may also be coupled to the JTAG boundary scan service provider 360. Alternatively, powering leads 354 and 356 may be coupled to another suitable device. Leads 352 and powering leads 354 and 356 may have, in particular embodiments, a male or female configuration (or any configuration complementary to leads 314 and powering leads 316 and 318, respectively, in connector 312) and comprise any suitable conducting material. Leads 352 in plug 350 may include any suitable number of leads to couple service provider 360 to management circuit 320 through circuit interface 310 (and not necessarily the amount illustrated in FIG. 4). In particular embodiments, powering leads 354 and 356 may be coupled together at plug 350. In alternate embodiments, powering leads 354 and 356 may be coupled in another suitable location, such as, for example, at service provider 360. In particular embodiments, any other suitable configuration may be used that allows power source 330 to be manually coupled to management circuit 320 during a JTAG management service.

JTAG boundary scan service provider 360 is operable to transmit and receive management signals to and from the JTAG-compatible circuit board devices 370, respectively, during the JTAG boundary scan service, thereby assessing the performance of JTAG-compatible circuit board devices 370. In particular embodiments, JTAG boundary scan service provider 360 may comprise, for example, a signal processor or any other suitable computing device. As mentioned above, the JTAG boundary scan service is normally performed infrequently, typically by the manufacturer of the circuit board before the circuit board is sold (although the procedure may be performed by any suitable party and/or after sale as well). In particular embodiments, JTAG signals transmitted may include, for example, a test clock signal (TCK), a mode input signal (TMS) (which provides the control logic for JTAG), and a serial data input signal to all JTAG instruction and data registers (TDI). In particular embodiments, JTAG signals may include different or additional signals as well.

In particular embodiments, JTAG-compatible circuit board devices 370 include any device on a circuit board that participates in the JTAG management service. In particular embodiments, there may be one or more JTAG-compatible circuit board devices 370 on the circuit board communicatively coupled to JTAG management circuit 320 (and not necessarily the amount shown in FIG. 4). JTAG-compatible circuit board devices 370 may conform to the JTAG boundary scan standard (IEEE Standard 1149.1), and may be managed by JTAG boundary scan service provider 360 during a JTAG management service. In particular embodiments, there may be a relation between the number of JTAG-compatible circuit board devices 370 and the number of management circuit devices 322 of JTAG management circuit 320.

In operation, in particular embodiments, a JTAG boundary scan service begins when plug 350 connects to JTAG circuit interface 310, and JTAG boundary scan service provider 360 begins transmitting and receiving signals to and from JTAG-compatible circuit board devices 370. After JTAG boundary scan service provider 360 transmits a signal, one or more leads 352 in plug 350 receive the signal and pass the signal to JTAG circuit interface 310. Connecting powering leads 354 and 356 of plug 350 to powering leads 316 and 318 of JTAG circuit interface 310, respectively, powers JTAG management circuit 320, allowing power to flow through circuit 320. JTAG circuit interface 310 receives the JTAG service provider's signal at leads 314 in connector 312 and passes the signal along one or more of the leads 314 to management circuit devices 322 of management circuit 320. In the JTAG context, management circuit devices 322 may include buffers that buffer the signal and pass the buffered signal to JTAG-compatible circuit board devices 370. JTAG-compatible circuit board devices 370 receive the passed signal. Based on the JTAG signals that they receive, devices 370 output one or more signals. JTAG boundary scan service provider 360 receives these signals from devices 370 and assesses devices 370. This process continues until JTAG boundary scan service ends, at which point plug 350 is manually disconnected from JTAG circuit interface 310.

As opposed to JTAG boundary scan system 100 of FIG. 2, it is less likely that example JTAG boundary scan system 300 of FIG. 4 inefficiently generates heat (or wastes power) after a JTAG management service has ended. Instead, in particular embodiments, once a JTAG management service has ended, plug 350 is removed from circuit interface 310. Removal of plug 350 (and powering leads 354 and 356) removes the connection between power source 330 and JTAG management circuit 320. Without a power source 330 in the JTAG management circuit 320, current does not flow through circuit 320, thereby conserving power. In some embodiments, the power conserved per management circuit device 322 according to example system 300 may be approximately two hundred and fifty milliwatts. This is a considerable power savings (and reduction in heat generation) if one considers how many management circuit devices may be used in one circuit board (or in one shelf comprising more than one circuit board). Thus, system 300 provides a substantial advantage in power conservation over typical systems 100 of FIG. 2.

The power savings of example system 300 may be greater than that in example system 200 because, for example, power is disconnected in example system 300, rather than the enable control. By disconnecting power in example system 300 (instead of disconnecting the enable control, as in example system 200), no bias current may flow through example circuit 320. Disconnecting the enable control, as in example system 200, may still allow bias current to flow from the power supply through the circuit. In particular embodiments of system 200, bias current flowing through the disabled circuit 220 may be approximately sixty-four milliamps. Other embodiments of system 200 may have other amounts of bias current. In addition, example system 300 may disable management circuit devices that may not support enable or standby mode. It should be noted again that though in the particular embodiment illustrated in FIG. 4, powering leads 354 and 356 create a loop such that power is provided to management circuit 320 when plug 350 is coupled to JTAG circuit interface 310, other embodiments may include any suitable loop or other suitable configuration allowing power source 330 to be manually coupled to management circuit 320 during a JTAG management service.

It should be noted again also that although the illustrated embodiment of FIG. 4 couples a power supply 330 through plug 350 to power management circuit 320 only during a management service, alternate embodiments may couple ground 332 (or ground 332 and enable 340), instead of power 330, through the plug 350 to power the management circuit 320 during a management service. In those embodiments, the power source 330 may be coupled to the circuit 320 at all times. In those embodiments, the management circuit 320 would not be powered until coupled to ground 332 through the plug 350. In alternate embodiments, both power source 330 and ground 332 may be coupled to the management circuit 320 solely through plug 350 (and not at all times), powering management circuit 320 only when coupled to management circuit 320 through plug 350 during a management service.

As discussed above, although system 300 has been described in conjunction with JTAG boundary scan, in particular embodiments, system 300 may be used in conjunction with other management services, such as, for example, diagnostic tests, synchronization procedures, maintenance checks, debugging analyses, programming, configuration, and upgrades of one or more components of a circuit board. Modifications, additions, or omissions may be made to system 300 described without departing from the scope of the invention. The components of system 300 described may be integrated or separated according to particular needs. Moreover, the operations of system 300 may be performed by more, fewer, or other components.

FIG. 5 is a flowchart 400 of an example method of manufacturing the management circuitry of FIG. 3 according to one embodiment of the present invention. Although flowchart 400, in particular embodiments, may be used to manufacture management circuitry for any management service, example flowchart 400 will be described below in conjunction with management circuitry for a JTAG boundary scan management service.

Flowchart 400 begins at step 410, where a JTAG management circuit is provided. In particular embodiments, the JTAG management circuit may include one or more management circuit devices. In the JTAG context, in particular embodiments, management circuit devices may include buffers operable to buffer test signals, such as a JTAG test clock signal. Any suitable number of management circuit devices may be provided in any suitable configuration. In particular embodiments, the management circuit devices may be coupled to JTAG-compatible circuit board devices. JTAG-compatible circuit board devices include any device on a circuit board that participates in the JTAG management service. JTAG-compatible circuit board devices may conform to the JTAG boundary scan standard (IEEE Standard 1149.1), and may be assessed by a JTAG boundary scan service provider.

Management circuit devices may be coupled to a power source, by, for example, circuit board leads, wires, and/or any other conducting material. Power source may include any power source delivering any amount of power suitable to power the JTAG management circuit. In particular embodiments, the power source may supply direct current voltage ($V_{cc}$) to the management circuit. For example, the power source may supply 3.3 volts of direct current voltage in particular embodiments. The power source may be located in any suitable location, and may comprise, for example, a shelf power source in particular embodiments. Management circuit devices may also be coupled to ground in any suitable manner. Ground may be located in any suitable location.

At step 420, a JTAG circuit interface is provided. In particular embodiments, a JTAG circuit interface may comprise a connector and any suitable number of leads. Connector may house the leads. Leads may have, in particular embodiments, a male or female configuration (or any configuration complementary to the leads of the plug provided, as discussed below) and comprise any suitable conducting material. At least one "enabling" lead is included, such that, when coupled to the JTAG management circuit and to a corresponding enabling lead on the plug (as discussed above), the enabling lead of the JTAG circuit interface enables the JTAG management circuit during a JTAG management service. The leads may include any suitable number of leads, such that when coupled to the JTAG management circuit and to a plug coupled a JTAG boundary scan service provider, the leads of JTAG circuit interface may be suitable to couple these devices.

At step 430, the JTAG circuit interface is coupled to the JTAG management circuit. In particular embodiments, the leads of JTAG circuit interface connect to the JTAG management circuit such that any signals received by the leads of the JTAG circuit interface (say, from a management service provider) travel through the one or more management circuit devices before reaching the circuit board devices participating in the management service. In the JTAG context, management circuit devices may include buffers that may buffer the signals before those signals reach the circuit board devices. Again, in particular embodiments, one of the leads (the enabling lead) in JTAG circuit interface may be connected to the management circuit such that when coupled to the JTAG management circuit and to a corresponding enabling lead on the plug (as discussed above), the enabling lead of the JTAG circuit interface enables the management circuit devices in the JTAG management circuit during a JTAG management service. More specifically, in the JTAG context, the plug is operable to connect to the JTAG circuit interface and the JTAG boundary scan service provider (described below), thereby coupling the JTAG management circuit to the JTAG boundary scan service provider during a JTAG boundary scan service. The enabling lead of the plug is coupled to any enabling control. The enabling control may be located in any suitable location, including, for example, in JTAG boundary scan service provider. In alternate embodiments, the enabling control may be located in any other suitable device. When the enabling lead of the plug is connected to the enabling lead of the connector during a management service, the enabling lead of the plug connects the enabling lead of the connector to the enable control, enabling the management circuit. When the enabling lead of the plug is disconnected from the enabling lead of the connector after a management service ends, the enabling lead of the connector no longer enables the JTAG management circuit. Power is thus conserved in the management circuit.

Although flowchart 400 describes a particular order of steps for manufacturing the management circuitry of FIG. 3 in accordance with a particular embodiment of the present invention, particular embodiments of the present invention may use all, some, or none of the steps described above. Moreover, particular embodiments may perform those steps in a different order than that described above without departing from the teachings of the present invention.

FIG. 6 is a flowchart 500 of an example method of manufacturing the management circuitry of FIG. 4 according to another embodiment of the present invention. Although flowchart 500, in particular embodiments, may be used to manufacture management circuitry for any management service, example flowchart 500 will be described below in conjunction with management circuitry for a JTAG boundary scan management service.

Flowchart 500 begins at step 510, where a JTAG management circuit is provided. In particular embodiments, the JTAG management circuit may include one or more management circuit devices. In the JTAG context, in particular embodiments, management circuit devices may include buffers operable to buffer test signals, such as a JTAG test clock signal. Any suitable number of management circuit devices may be provided in any suitable configuration. In particular embodiments, the management circuit devices may be coupled to JTAG-compatible circuit board devices. JTAG-compatible circuit board devices include any device on a circuit board that participates in the JTAG management service. JTAG-compatible circuit board devices may conform to the JTAG boundary scan standard (IEEE Standard 1149.1), and may be managed by a JTAG boundary scan service provider. In particular embodiments, the management circuit devices may be coupled to ground in any suitable manner. Ground may be located in any suitable location. In particular embodiments, the management circuit devices may also be coupled to an enable control. In alternate embodiments, the management circuit devices may not be coupled to an enable control (if they do not support enable or standby mode). The enable control may be located in any suitable location and may be coupled to management circuit devices in any suitable manner.

At step 520, a power source is provided. In particular embodiments, the power source may include any power source delivering any amount of power suitable to power the JTAG management circuit. In particular embodiments, the power source may supply direct current voltage ($V_{cc}$) to the management circuit. For example, the power source may supply 3.3 volts of direct current voltage in particular embodiments. The power source may be located in any suitable location, and may comprise, for example, a shelf power source in particular embodiments.

At step 530, a JTAG circuit interface is provided. In particular embodiments, JTAG circuit interface may comprise a connector and any suitable number of leads. In particular embodiments, the connector may house the leads. The leads may have, in particular embodiments, a male or female configuration (or any configuration complementary to the leads of the plug provided, as discussed below) and comprise any suitable conducting material. In particular embodiments, at least one of the leads includes a powering lead that may be coupled to a power source. This lead may be electrically coupled to the JTAG management circuit when the powering lead is coupled by a plug to the JTAG management circuit. At least one of the leads also includes another powering lead that may be coupled to the management circuit devices of the JTAG management circuit such that the powering lead provides power to the management circuit devices when the powering lead is coupled through the plug (described above) to the other powering lead coupled to the power source. The leads in the JTAG circuit interface may include any suitable number of leads, such that when coupled to the JTAG management circuit and to a plug coupled to a JTAG boundary scan service provider, the leads of JTAG circuit interface may be suitable to couple these devices.

At step 540, the JTAG circuit interface is coupled to the JTAG management circuit. In particular embodiments, the leads of JTAG circuit interface may connect to the JTAG management circuit such that any signals received by the leads of the JTAG circuit interface (say, from a management service provider) travel through the one or more management circuit devices before reaching the circuit board devices participating in the management service. In the JTAG context, management circuit devices may include buffers that may buffer the signals before those signals reach the circuit board devices. Again, in particular embodiments, one of the powering leads in JTAG circuit interface may be coupled to the management circuit At step 550, the JTAG circuit interface is coupled to the power source. In particular embodiments, one of the powering leads of the JTAG circuit interface may. be coupled to the power source such that when the interface's powering lead coupled to the power source and the interface's powering lead coupled to the management circuit are coupled to corresponding powering leads of the plug (as discussed above), the powering leads of the JTAG circuit interface are coupled together and provide power to the management circuit devices of the JTAG management circuit.

It should be noted that the example flowchart describes the method of manufacture for the embodiment where a power source may be coupled to a management circuit to power the management circuit during a management service. The example flowchart may be suitably changed to describe alternate embodiments where a ground (or ground and enable control), instead of a power source, may be coupled to a management circuit through a plug to power the management circuit during a management service. In those embodiments, the power source may be coupled to the circuit at all times. The flowchart may also be suitably changed to describe alternate embodiments where both a power source and ground may be coupled to a management circuit to power the management circuit solely during a management service (and are not coupled to the circuit at all times).

Although flowchart 500 describes a particular order of steps for manufacturing the management circuit of FIG. 4 in accordance with a particular embodiment of the present invention, particular embodiments of the present invention may use all, some, or none of the steps described above. Moreover, particular embodiments may perform those steps in a different order than that described above without departing from the teachings of the present invention.

Although the present invention has been described with several embodiments, various changes and modifications may be suggested to one skilled in the art. It is intended that the present invention encompass such changes and modifications as fall within the scope of the appended claims.

What is claimed is:

1. A system for providing a circuitry management service, comprising:
   a management circuit interface configured to receive a plug associated with a management service; and
   a management circuit operable to facilitate the management service by managing or assessing the performance of one or more circuit board devices of a circuit board, the management circuit comprising one or more management circuit devices, the management circuit coupled to the management circuit interface such that one or more of the management circuit devices are enabled only when the management circuit interface receives the plug.

2. The system of claim 1, wherein the management service comprises a JTAG boundary scan service.

3. The system of claim 1, wherein the management service comprises a BITS synchronization service.

4. The system of claim 1, further comprising the one or more circuit board devices operable to be managed by the management service and communicatively coupled to the management circuit.

5. The system of claim 1, wherein the management circuit is on the circuit board and wherein the circuit board is installed in a shelf.

6. The system of claim 1, wherein at least one of the one or more management circuit devices comprises a buffer.

7. A system for providing a circuitry management service, comprising:

a management circuit interface configured to receive a plug associated with a management service;

a power source; and a management circuit operable to facilitate the management service by managing or assessing the performance of one or more circuit board devices of a circuit board, the management circuit comprising one or more management circuit devices coupled to ground, the management circuit coupled to the management circuit interface such that one or more of the management circuit devices are coupled to the power source only when the management circuit interface receives the plug.

8. The system of claim 7, wherein the management service comprises a JTAG boundary scan service.

9. The system of claim 7, wherein the management service comprises a BITS synchronization service.

10. The system of claim 7, further comprising the one or more circuit board devices operable to be managed by the management service and communicatively coupled to the management circuit.

11. The system of claim 7, wherein the management circuit is on the circuit board and wherein the circuit board is installed in a shelf.

12. The system of claim 7, wherein at least one of the one or more management circuit devices comprises a buffer.

13. The system of claim 7, wherein the power source comprises a shelf power source.

14. A method of manufacturing a circuit, comprising:

providing a management circuit interface configured to receive a plug associated with a management service;

providing a management circuit operable to facilitate the management service by managing or assessing the performance of one or more circuit board devices of a circuit board, the management circuit comprising one or more management circuit devices; and coupling the management circuit interface to the management circuit such that one or more of the management circuit devices are enabled only when the management circuit interface receives the plug.

15. The method of claim 14, wherein the management service comprises a JTAG boundary scan service.

16. The method of claim 14, wherein the management service comprises a BITS synchronization service.

17. The method of claim 14, further comprising providing the one or more circuit board devices operable to be managed by the management service and communicatively coupled to the management circuit.

18. The method of claim 14, wherein the management circuit is on the circuit board and wherein the circuit board is installed in a shelf.

19. The method of claim 14, wherein at least one of the one or more management circuit devices comprises a buffer.

20. A method of manufacturing a circuit, comprising:

providing a management circuit interface configured to receive a plug associated with a management service;

providing a power source;

providing a management circuit operable to facilitate the management service by managing or assessing the performance of one or more circuit board devices of a circuit board, the management circuit comprising one or more management circuit devices coupled to ground; and coupling the management circuit interface to the management circuit such that one or more of the management circuit devices are coupled to the power source only when the management circuit interface receives the plug.

21. The method of claim 20, wherein the management service comprises a JTAG boundary scan service.

22. The system of claim 20, wherein the management service comprises a BITS synchronization service.

23. The method of claim 20, further comprising providing the one or more circuit board devices operable to be managed by the management service and communicatively coupled to the management circuit.

24. The method of claim 20, wherein the management circuit is on the circuit board and wherein the circuit board is installed in a shelf.

25. The method of claim 20, wherein at least one of the one or more management circuit devices comprises a buffer.

26. The method of claim 20, wherein the power source comprises a shelf power source.

27. A system for providing a circuitry management service, comprising:

a management circuit interface configured to receive a plug associated with a management service; and a management circuit operable to facilitate the management service by managing or assessing the performance of one or more circuit board devices of a circuit board, the management circuit comprising one or more management circuit devices coupled to a power source, the management circuit coupled to the management circuit interface such that one or more of the management circuit devices are coupled to ground only when the management circuit interface receives the plug.

28. The system of claim 27, wherein the management circuit is coupled to the management circuit interface such that one or more of the management circuit devices are enabled only when the management circuit interface receives the plug.

29. A system for providing a circuitry management service, comprising:

a management circuit interface configured to receive a plug associated with a management service;

a power source; and a management circuit operable to facilitate the management service by managing or assessing the performance of one or more circuit board devices of a circuit board, the management circuit comprising one or more management circuit devices, the management circuit coupled to the management circuit interface such that one or more of the management circuit devices are coupled to the power source and to ground only when the management circuit interface receives the plug.

* * * * *